(12) United States Patent
Yamada et al.

(10) Patent No.: US 8,576,647 B2
(45) Date of Patent: Nov. 5, 2013

(54) SEMICONDUCTOR DEVICE

(75) Inventors: Yuya Yamada, Tokyo (JP); Ichiro Abe, Tokyo (JP)

(73) Assignee: Elpida Memory, Inc., Tokyo (JP)

(*) Notice: Subject to any disclaimer, the term of this patent is extended or adjusted under 35 U.S.C. 154(b) by 186 days.

(21) Appl. No.: 13/288,994

(22) Filed: Nov. 4, 2011

(65) Prior Publication Data

US 2012/0113734 A1    May 10, 2012

(30) Foreign Application Priority Data

Nov. 5, 2010   (JP) .................................. 2010-248776

(51) Int. Cl.
*G11C 29/00* (2006.01)

(52) U.S. Cl.
USPC ............................ 365/201; 365/205; 365/203

(58) Field of Classification Search
USPC .................................. 365/201, 205, 203, 149
See application file for complete search history.

(56) References Cited

U.S. PATENT DOCUMENTS

| 6,094,390 A | 7/2000 | Inaba et al. |
| 6,262,926 B1 * | 7/2001 | Nakai ........................... 365/200 |
| 7,162,660 B2 * | 1/2007 | Ogino ........................... 714/6.13 |

FOREIGN PATENT DOCUMENTS

| JP | 04-121900 | 4/1992 |
| JP | 10-313101 | 11/1998 |

* cited by examiner

*Primary Examiner* — Huan Hoang
(74) *Attorney, Agent, or Firm* — Young & Thompson

(57) ABSTRACT

A semiconductor device includes a bit line; a data bus line corresponding to the bit line; a selection transistor that controls electrical connection between the bit line and the data bus line; a write amplifier that writes data to the bit line through the data bus; and a test circuit. The test circuit sets the bit line to a first potential during a test period regardless of an operation of the write amplifier, sets the data bus line to a second potential and then sets the data bus line in a floating state to detect transition of the data bus line from the second potential to the first potential, with the selection transistor being activated to electrically connect the bit line and the data bus line.

20 Claims, 8 Drawing Sheets

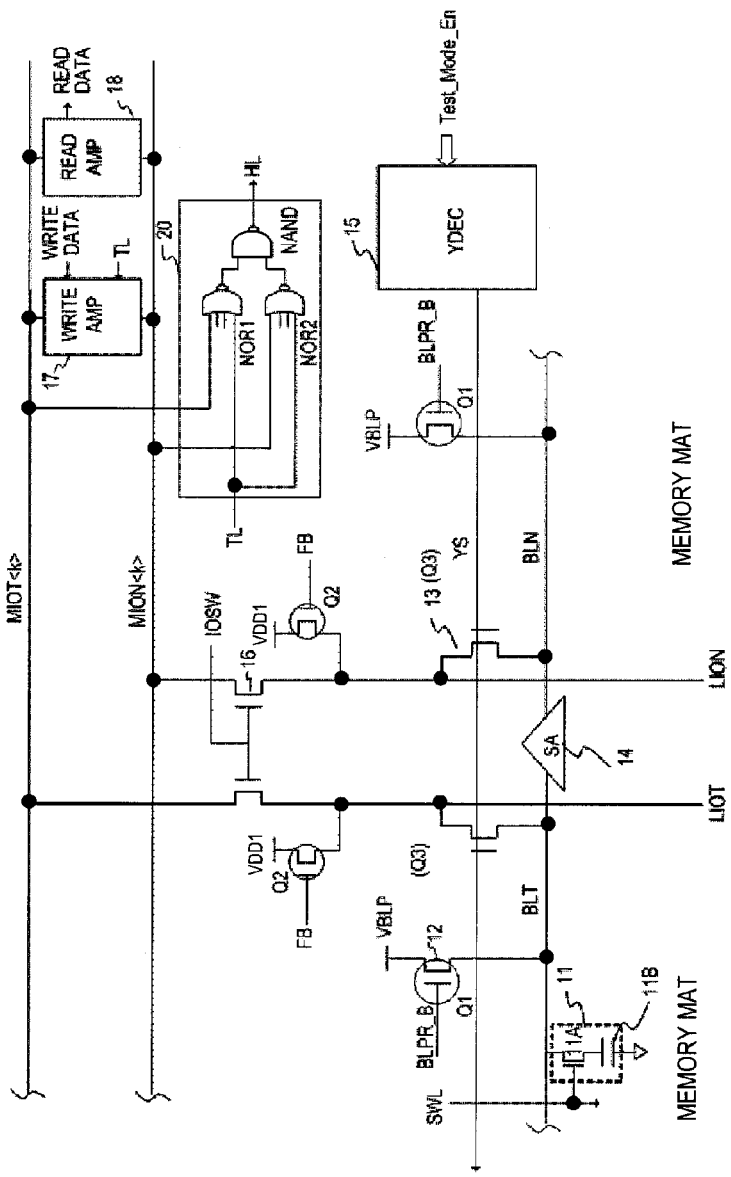
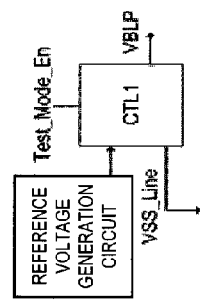
FIG. 8A
FIG. 8B
FIG. 8C

SEMICONDUCTOR DEVICE

REFERENCE TO RELATED APPLICATION

This application is based upon and claims the benefit of the priority of Japanese patent application No. 2010-248776, filed on Nov. 5, 2010, the disclosure of which is incorporated herein in its entirety by reference thereto.

The present invention relates to a semiconductor device. The invention relates to a semiconductor device including a memory cell array, for example.

BACKGROUND

Configuration of Common DRAM

The following describes the outline of a DRAM (Dynamic Random Access Memory), as a related-art semiconductor device. FIG. 1 is a diagram schematically showing a configuration example of a general DRAM. As shown in FIG. 1, the DRAM includes a memory array 1, an X decoder and X timing generation circuit 2, a Y decoder and Y timing generation circuit 3, a decoder control circuit 4, a DLL (Delay Locked Loop) 9, a data latch circuit 5, an input/output interface 6, an internal clock (CLK) generation circuit 7, and a control signal generation circuit 8. The memory cell array 1 includes banks 0 to m. Each bank includes memory mats 1, 2, and 3. A bank configuration, a memory mat configuration within each bank, and the like are not of course limited to the above-mentioned configurations. The control signal generation circuit 8 receives command signals (/CS (chip select), /RAS (row address strobe), /CAS (column address strobe), and /WE (write enable)), decodes the command, generates control signals according to a result of the decoding of the command, and outputs the generated control signals to the X decoder and X timing generation circuit 2, Y decoder and Y timing generation circuit 3, decoder control circuit 4. It is noted that a symbol "/" before the name of a signal indicates that the signal is active when the signal assumes a Low level. A row address of an input address signal (ADD) is decoded by the X decoder 2, and a word line WL is selected by a sub-word driver (SWD). When the word line WL is selected, data are read out from memory cells (MC) that are connected to the word line WL, to bit lines (BL) which are connected to the selected memory cells and then amplified by sense amplifiers (SA) that are connected respectively to the bit lines. A column address of the address signal (ADD) is decoded by the Y decoder 3. The Y decoder 3 sets a selected column selection signal active to select the bit line (BL) and the sense amplifier (SA).

An output (read data) amplified by the sense amplifier (SA) is transferred to the data latch circuit 5 and the input/output interface 6, and is then output to an outside through a DQ pin. DQ pins (DQ terminals) are a plurality of pins and so-called I/O terminals which input data from an outside and output data to an outside. Data strobe signals DQS and /DQS are each a trigger signal for latching data when the data is received from an outside. A data mask signal DM is a control signal for masking data. When the data mask signal DM is set to High simultaneously with input of data, writing of the data to a memory cell is masked (inhibited), so that the writing is not performed (or the write amplifier is output-disabled). A terminal for the data mask signal DM is an external terminal of the semiconductor device. A plurality of external terminals are provided for the data mask signals DM. Each data mask signal DM is associated with one of a plurality of groups formed by corresponding ones of the DQ terminals.

When data is written into a memory cell, the data mask signal DM is set to Low and the data is supplied to the DQ pin. The write data is transferred through the input/output interface 6 and the data latch circuit 5 to a sense amplifier (SA) which is selected by the Y decoder 3. The sense amplifier (SA) drives the bit line (BL) in accordance with the write data, and writes the data into the memory cell connected to the bit line (BL) and the selected word line.

<Hierarchical Data Line Structure>

FIG. 2 is a diagram schematically showing a hierarchical data line structure (hierarchical I/O scheme). Though not limited thereto, there is adopted an open bit line system in which a pair of bit lines BLT and BLN connected to a sense amplifier (SA) 14 are respectively assigned to mutually different memory mats (memory mats 1 and 2 in FIG. 2). It is noted that the letter T in the bit line BLT indicates True (non-inversion), while the letter N in the bit line BLN indicates Bar (inversion: inversion of BLT). Similarly, letters T and N in each of local input/output lines LIOT and LION and main input/output lines MIOT and MION indicate True and Bar, respectively.

A plurality of LIO line pairs LIOT/LION are connected to a MIO line pair MIOT/MION through switches. For facilitating explanation, FIG. 2 shows only one LIO line pair LIOT/LION connected to the MIO line pair MIOT/MION through a pair of switches 16. The pair of switches 16 corresponds to a switch (SWC) 10 in FIG. 1 and includes, for example, NMOS transistors with gates thereof connected to a control signal IOSW. Turning on/off (conduction/non-conduction) of the NMOS transistors is commonly controlled by a High/Low level of the control signal IOSW. A LIO line pair LIOT/LION and a MIO line pair MIOT/MION connected to a pair of switches 16 that are set to be on, are electrically connected. A sub-amplifier (not shown) for receiving read data transmitted to the LIO line pair LIOT/LION and driving the MIO line pair MIOT/MION by the read data may be further provided at a connecting portion (pair of switches 16: switch 10 in FIG. 1) between the LIOT line pair LIOT/LION and the MIOT line pair MIOT/MION.

A plurality of sense amplifiers (SA) 14 of the open bit line system are respectively connected to the LIO line pair LIOT/LION through column selection transistors (also referred to as "Y switches") 13. For simplicity, FIG. 2 shows only one sense amplifier 14 connected to the LIO line pair LIOT/LION through a pair of column selection transistors 13. Each column selection transistor 13 is composed by an NMOS transistor with a gate thereof connected to a column selection signal YS (or also referred to as a column selection signal CSL) output from a column decoder (YDEC) 15 that decodes a column address. Turning on/off (conduction/non-conduction) of the NMOS transistor is controlled by a High/Low level of the column selection signal YS. When the selected column selection signal YS goes High, and one pair of the column selection transistors 13 turn on (become conductive), the bit line BLT and the LIO line LIOT are electrically connected, and the bit line BLN and the LIO line LION are electrically connected.

The bit lines BLT and BLN of cell arrays (memory mats 1 and 2) arranged on both sides of the sense amplifier (SA) 14 are connected to first and second nodes of the sense amplifier (SA) (which is an open bit line structure). A memory cell 11 connected to the bit line BLT includes a cell transistor (NMOS transistor) 11A with a gate thereof connected to a word line (sub-word line) SWL and a drain thereof connected to the bit line BLT, and a capacitor (capacitor for holding data) 11B with one end thereof connected to a source of the cell transistor and the other end thereof connected to an electrode (plate electrode). A PMOS transistor 12 with a source thereof connected to a precharge line VBLP and a drain thereof connected to each of the bit line pair BLT and BLN constitutes a bit line precharge circuit. A gate of the PMOS transistor 12 receives an equalize control signal BLPR_B. A precharge power supply (such as ½ VDD) is supplied to the precharge line VBLP from a reference voltage circuit not shown. In the case of a folded bit line structure, a bit line pair BLT/BLN extended in the memory mat 1 is connected to the first node of the sense amplifier (SA) 14 through a first transfer gate, and a bit line pair BLT/BLN extended in the memory mat 2 is connected to the second node through a second transfer gate.

A read amplifier 18 (also referred to as a "main amplifier") and a write amplifier 17 are connected to the MIO line pair MIOT/MION. When reading data from a memory cell, the data in the memory cell (such as the memory cell 11) connected to the selected sub-word line SWL is transmitted to the sense amplifier 14 through the bit line (such as the bit line BLT). It is noted that the pair of the bit lines BLT and BLN is precharged to a predetermined precharge potential VBLP (such as ½ VDD) before starting the reading operation. The sense amplifier 14 differentially amplifies potentials of the pair of the bit lines BLT and BLN, and signals obtained by amplification by the sense amplifier 14 for a selected column are transmitted to the LIO line pair LIOT/LION through one pair of the column selection transistors 13, and are further transmitted to the MIO line pair MIOT/MION through the switches 16. The read amplifier 18 differentially amplifiers the read data transmitted to the MIO line pair MIOT/MION. An output (read data) from the read amplifier 18 is supplied to the data latch circuit 5 in FIG. 1 through a read/write bus (not shown). The write amplifier 17 is deactivated at a time of reading, and an output of the write amplifier 17 is brought into a high-impedance state.

At a time of writing, the write amplifier 17 receives write data supplied from the DQ terminal and transferred through the input/output interface 6 and the data latch circuit 5, and differentially drives the MIO line pair MIOT/MION according to the value of the write data. The data on the MIO line pair MIOT/MION is transferred to the sense amplifier 14 for a selected column through a selected one of the LIO line pairs LIOT/LION, and is then written into the memory cell connected to a selected word line.

<Configuration Example of Bit Line System>

FIG. 3 is a diagram showing a configuration example of a bit line system (open bit line system) in the hierarchical I/O scheme. In the configuration example in FIG. 3, there are provided bit lines DL-A-0, DL-B-0, DL-C-0, and DL-D-0 extended on the side of a cell array 0 and bit lines /DL-A-0, /DL-B-0, /DL-C-0, and /DL-D-0 extended on the side of a cell array 1. It is noted that /DL-A-0, for example, represents a complementary signal of DL-A-0, in which a symbol "/" and a signal name indicates a complementary signal of a signal having the signal name. There are also provided eight PMOS transistors Q1 connected between the precharge line VBLP and the respective bit lines DL-A-0, DL-B-0, DL-C-0, DL-D-0, /DL-A-0, /DL-B-0, /DL-C-0, and /DL-D-0. Each of the PMOS transistors Q1 receives a precharge signal BLPR_B at a gate thereof and is set to a precharge power supply VBLP when each of the PMOS transistors Q1 turns on. There are also provided PMOS transistors Q1 between the precharge line VBLP and respective bit lines DL-A-1 and /DL-A-1 to DL-D-1 and /DL-D-1, DL-A-N and /DL-A-N to DL-D-N and /DL-D-N.

One of column selection signals YS0 to YSN for a selected one of columns is set High, and in response to the High level, one bit line pair out of (N+1) pairs of the bit lines DL-A-0 and /DL-A-0 to DL-A-N and /DL-A-N is connected to a pair of LIO lines LIOT-A and LION-A, one bit line pair out of (N+1) pairs of the bit lines DL-B-0 and /DL-B-0 to DL-B-N and /DL-B-N is connected to a pair of LIO lines LIOT-B and LION-B, one bit line pair out of (N+1) pairs of the bit lines DL-C-0 and /DL-C-0 to DL-C-N and /DL-C-N is connected to a pair of LIO lines LIOT-C and LION-C, and one bit line pair of (N+1) pairs of the bit lines DL-D-0 and /DL-D-0 to DL-D-N and /DL-D-N are connected to a pair of LIO lines LIOT-D and LION-D.

Referring to FIG. 3, a main amplifier (including the write amplifier 17 and the read amplifier 18 in FIG. 2) is connected between the MIOT and MION lines connected to each of the pairs of the LIO lines LIOT-A and LION-A, the LIO lines LIOT-B and LION-B, the LIO lines LIOT-C and LION-C, and the LIO lines LIOT-D and LION-D through switches. In FIG. 3, only for the sake of simplicity, the main amplifier is illustrated to be connected between each of the pairs of the LIO lines LIOT-A and LION-A, the LIO lines LIOT-B and LION-B, the LIO lines LIOT-C and LION-C, and the LIO lines LIOT-D and LION-D.

As shown in FIG. 3, NMOS transistors Q3 are respectively connected between the bit line DL-A-0 and the LIO line LIOT-A, between the bit line /DL-A-0 and the LIO line LION-A, between the bit line DL-B-0 and the LIO line LIOT-B, between the bit line /DL-B-0 and the LIO line LION-B, between the bit line DL-C-0 and the LIO line LIOT-C, between the bit line /DL-C-0 and the LIO line LION-C, between the bit line DL-D-0 and the LIO line LIOT-D, and between the bit line /DL-D-0 and the LIO line LION-D. Then, turning on/off (conduction/non-conduction) of the NMOS transistors Q3 are commonly controlled by the column selection signal YS0.

NMOS transistors Q3 are respectively connected between the bit line DL-A-1 and the LIO line LIOT-A, between the bit line /DL-A-1 and the LIO line LION-A, between the bit line DL-B-1 and the LIO line LIOT-B, between the bit line /DL-B-1 and the LIO line LION-B, between the bit line DL-C-1 and the LIO line LIOT-C, between the bit line /DL-C-1 and the LIO line LION-C, between the bit line DL-D-1 and the LIO line LIOT-D, and between the bit line /DL-D-1 and the LIO line LION-D. Then, turning on/off of the NMOS transistors Q3 is commonly controlled by the column selection signal YS1.

Similarly, NMOS transistors Q3 are connected between the bit line DL-A-N and the LIO line LIOT-A, between the bit line /DL-A-N and the LIO line LION-A, between the bit line DL-B-N and the LIO line LIOT-B, between the bit line /DL-B-N and the LIO line LION-B, between the bit line DL-C-N and the LIO line LIOT-C, between the bit line /DL-C-N and the LIO line LION-C, between the bit line DL-D-N and the LIO line LIOT-D, and between the bit line /DL-D-N and the LIO line LION-D. Then, turning on/off (conduction/non-conduction) of the NMOS transistors Q3 is commonly controlled by the column selection signal YSN.

<Redundancy Circuit>

In DRAMs, in order to rescue a defective cell, a configuration including a redundancy circuit is also employed, in which redundancy cells are provided. A fail map is generated by making determination of defective or non-defective cells, for example, in a wafer test of a semiconductor fabrication process, and a defective cell is replaced by a redundancy cell. When an access address coincides with the address of a defective cell, programming which includes for example, blowing of a corresponding fuse in a fuse circuit is performed so that the defective cell is not accessed and the address of the defective cell is replaced with an address for accessing a redundancy cell. When the redundancy cell is selected, control is performed so that a column selection transistor (column selection transistor to be rescued) for the bit line (bit line to be rescued) and the word line connected to the defective cell (cell to be rescued) are not selected (deactivated). That is, a gate electrode of the column selection transistor to be rescued which is connected to the bit line to be rescued is fixed at a Low level by a column selection signal and is brought into a non-selection state.

<Multiple-Selection State>

When a gate electrode of a column selection transistor (Y switch) is in a floating state due to a connection failure of a via which transmits a column selection signal to the gate electrode of the column selection transistor, the gate electrode of the column selection transistor is disconnected from the column selection signal, and cannot discharge electric charge at the gate electrode to the GND (ground). For this reason, when a potential of a neighboring wiring varies, for example, the gate electrode of the column selection transistor may assume a High level (or a gate-to-source voltage of the NMOS transistor constituting the column selection transistor exceeds its threshold voltage) due to capacitive coupling or the like. As a result, the column selection transistor that should not been selected may turn on (become conductive). In this case, both of the column selection transistor that should not been selected and a column selection transistor for the bit line selected for reading may be simultaneously selected (which is referred to as a "multiple-selection state"). This case may be beyond control. The following describes the problem with reference to FIG. 4.

A LIO line pair LIOT/LION is connected to a MIO line pair MIOT/MION through a switch pair. The LIO line pair LIOT/LION is connected to a pair of bit lines through column selection transistors. Bit line selection is performed by a column decoder (YDEC), and a column selection signal corresponding to a selected column is set to High by the column decoder (YDEC). Then, the column selection transistors with gate electrodes thereof connected to the column selection signal become conductive.

When reading data, a sense amplifier (SA) differentially amplifies a difference potential between the pair of the bit lines, and potentials of the selected bit lines are differentially output to the LIO lines LIOT and LION. The column selection signal supplied to the gate electrode of the column selection transistor (Y-Switch for reading) selected at the time of reading is set to have a High level. The data (which is High in FIG. 4) in a selected memory cell MC (for which a word line WL is High) connected to the selected bit line (Bit Line for reading) is read to the bit line (Bit Line for reading). It is usually expected that a High level be output to the LIO line LIOT through the column selection transistor (Y Switch for reading) and a Low level be output to the LIO line LION (Expectations of the High and Low levels).

On the other hand, the gate electrode of a column selection transistor (Y-Switch to be rescued) connected to the bit line to be rescued (Bit Line to be rescued) by a redundancy circuit is fixed at Low by the column selection signal so as to be constantly in a non-selected state. The following problem, however, may arise. The gate potential of the column selection transistor (Y-Switch) to be rescued may not be fixed at Low due to a connection failure of a via connected to the gate electrode and may go High in a floating state, and the column selection transistor (Y-Switch) to be rescued becomes conductive though the column selection transistor is not selected. In this case, data (at a Low level) in a memory cell MC connected to the bit line to be rescued and the selected word line and an inverted signal of the data are respectively output to the LIO lines LIOT and LION. As a result, though a read value (expectation value) of the LIO line LIOT should be usually High, the data (at a Low level) in the selected cell connected to the bit line to be rescued is simultaneously read, so that the read value goes Low. However, depending on an initial state or a potential at a floating portion, defective reading may not occur. In the example shown in FIG. 4, for example, the data in the memory cell MC to be rescued is set to Low. However, defective reading may not occur, depending on the initial state or the like. For example, when the data in the memory cell MC to be rescued is High, defective reading does not occur because the data in the memory cell MC to be rescued operates to strengthen the read data. That is, in this case, a read value (expectation value) of the LIOT becomes High.

In the multiple-selection state, a column selection transistor with a gate electrode thereof being in a floating state due to defective contact is brought into a selection state because the gate electrode of column selection transistor is in a High floating state, i.e., at a High level in a floating state. Then, in addition to the column selection transistor connected to a selected bit line, the column selection transistor (with the gate electrode in a High floating state) that should not be selected is also selected. This multiple-selection state may also occur for any one of the column selection transistors (Q3) shown in FIG. 3 or the like, being not limited to a case where control is performed over a bit line to be rescued in the redundancy configuration. Further, the multiple-selection state occurs when a gate-to-source voltage VGS of the column selection transistor that should not be selected exceeds a threshold voltage. The multiple-selection state may occur anytime, with no limitation in a time. When the multiple-selection state occurs in a write cycle, for example, the column selection transistor that should not be selected may turn on (becomes conductive), and data may be written to a memory cell connected to a bit line that should not be selected and becomes conductive to the LIO line due to the column selection transistor.

Patent Document 1 discloses a configuration of a semiconductor memory device in which reduction of a bit line capacitance is achieved by reducing the number of bit line contacts in a sense amplifier unit. Each of FIGS. 15 and 16 of Patent Document 1 discloses a configuration in which a column selection signal (YS) is supplied to gate electrodes of eight transistors through respective vias for the eight transistors. Patent Document 2 discloses as a data compression circuit a configuration including a two-input NAND circuit which receives outputs of two two-input NOR circuits. In this configuration, a logical sum of outputs of the two two-input NAND circuits are taken.

Patent Document 1

JP Patent Kokai Publication No. JP-H10-313101A, which corresponds to U.S. Pat. No. 6,094,390.

Patent Document 2

JP Patent Kokai Publication No. JP-H04-121900A

SUMMARY

The following describes an analysis of the related arts by the present inventors.

The above-mentioned open failure of a column selection transistor or the like appears as a defective local input/output line LIO, and the open failure is poorly reproducible. Accordingly, it is difficult to detect the open failure at a time of wafer inspection, production test, or the like, or after shipment of products, A product may be shipped without detection of an open failure in the product.

Further, even if a column including a column selection transistor with a gate open failure is rescued by a redundancy column at the time of wafer inspection, a gate potential of the column selection transistor may rise to High by some chance, and the local input/output line and the bit line to be rescued may be electrically connected (which is the multiple-selection state), inducing a malfunction or unpredicable behavior. Then, this problem of the multiple-selection state may occur in an arbitrary column selection transistor, being not limited to the case where control over a bit line to be rescued is performed in the redundancy configuration.

It is difficult to carry out a test for inducing a defect in the LIO line by setting the gate of a column selection transistor in a floating in order to detect the gate open failure of the column selection transistor.

Further, when a chip having a column selection transistor with a gate thereof set in a floating state is considered to be defective without being rescued, it is difficult to make distinction between the following failures:

(I) an open failure (floating state) of a gate of a column selection transistor;

(II) a defect of a sense amplifier or a defect of a bit line capable of being remedied to a good product by replacement using a redundancy column (redundancy rescue). That is, the gate open failure in item (I) is detected just as a defect for each bit line connected by the defective column selection transistor, when the open gate is to be turned off. For that reason, it is difficult to make distinction between this gate open failure and the defect of the sense amplifier or the defect of the bit line (bit line short) as listed in item (II). The problem described above may also occur when a redundancy circuit (redundancy function implemented by a redundancy memory) is not included in a semiconductor device. In this semiconductor device as well, it is important to carry out a test for inducing a defect in the LIO line with a gate of a column selection transistor in a floating state in order to detect the gate open failure of the column selection transistor.

The present invention which seeks to solve at least one of the above-mentioned problems, is generally configured as follows, but not limited thereto.

According to the present invention, there is provided a semiconductor device comprising:

a bit line;

a data bus line corresponding to the bit line;

a selection transistor that controls electrical connection between the bit line and the data bus line;

a write amplifier that writes data to the bit line through the data bus; and a test circuit, wherein during a test period, the test circuit sets the bit line to a first potential regardless of an operation of the write amplifier, sets the data bus line to a second potential and then sets the data bus line in a floating state, the selection transistor is activated to electrically connect the bit line and the data bus line, and the test circuit detects transition of the data bus line from the second potential to the first potential. When the data bus line does not transition from the second potential to the first potential, the selection transistor is decided to be defective.

According to the present invention, a defect or failure of the column selection transistor that controls connection between the bit line and the data bus line can be detected through the data bus line.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIGS. 8A to 8C are diagrams each showing a configuration of a third exemplary embodiment of the present invention.

PREFERRED MODES

Figure 1:
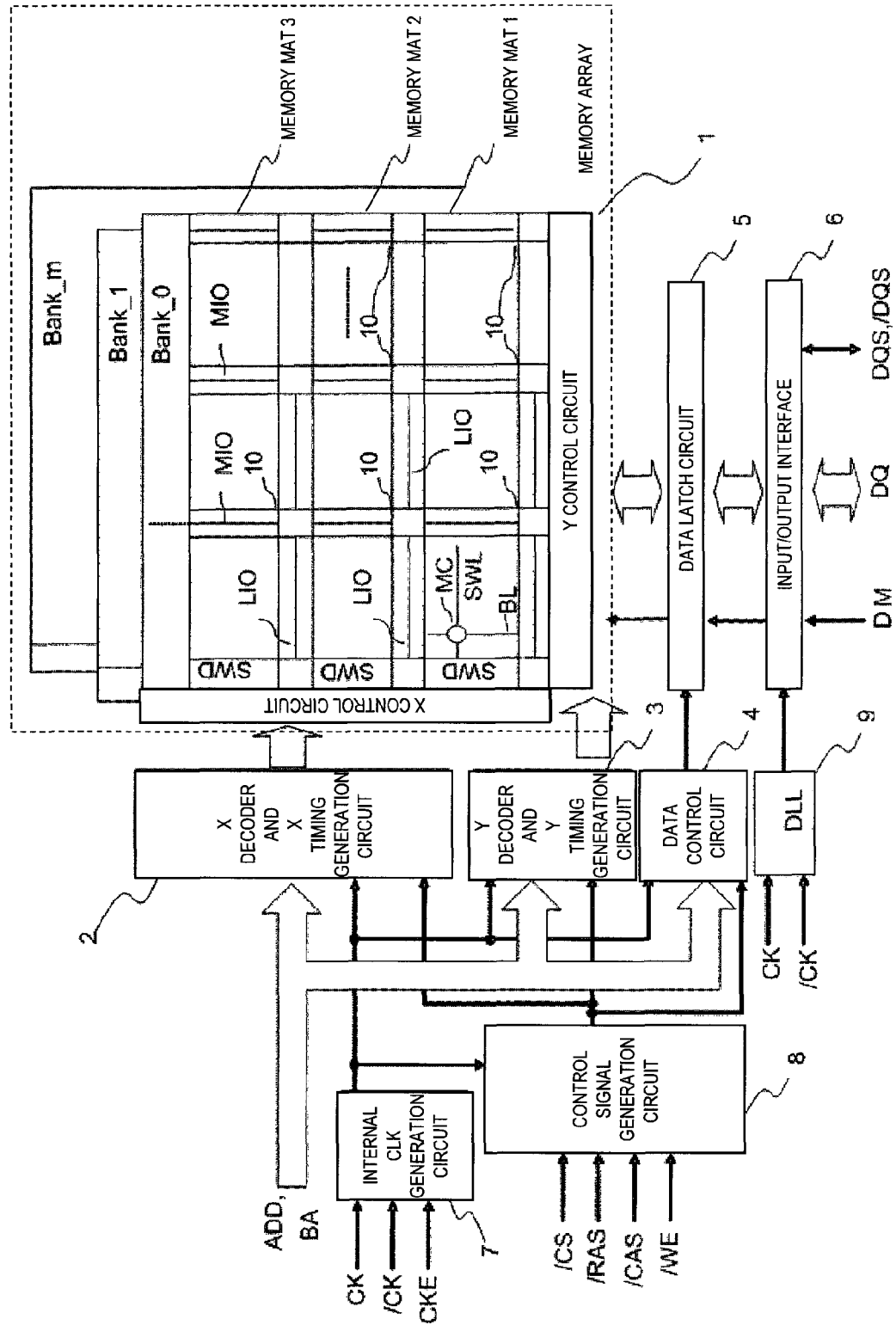
FIG. 1 is a diagram showing an overall configuration of a DRAM.

A typical example of technical concepts for solving the problems of the present invention is shown below. The claimed contents in the present application, however, are not limited to the technical concepts. Needless to say, the claimed contents in the present application are contents of claims of this application. A semiconductor device according to one of preferred modes of the present invention includes a test circuit (CTL2) that outputs first and second test control signals (FB, TL) when a test mode signal (Test_Mode_en) is activated, a first control circuit (CTL1) that controls a bit line precharge line (VBLP) at a predetermined potential (such as ½ VDD) at a time of normal operation to be at a first potential (VSS) in a DC manner, during a period in which the test circuit is enabled, a plurality of precharge elements (Q1) that respectively supply the first potential to a plurality of True and Bar bit lines (DL) in the DC manner during a predetermined second period in which the first test control signal (FB) assumes a second value, a plurality of column selection transistors (Q3) that electrically connect the plurality of bit lines and a plurality of data bus lines (LIO) respectively corresponding to the plurality of bit lines by a column select signal (YS), a plurality of precharge elements (Q2) for the plurality of data bus lines that respectively charge the plurality of data bus lines (LIO) to a second potential different from the first potential (VSS) during a predetermined period of time in which the first test control signal (FB) assumes a first value, and a detection circuit (20) that is enabled by the second test control signal (TL). The detection circuit (20) detects that all potentials of the plurality of data bus lines (LIO) change from the second potential to the first potential (VSS) of the bit line precharge line (VBLP) controlled by the first control circuit (CTL1), during a period in which the detection circuit (20) is enabled by the second test control signal (TL) and the column selection signal (YS) is controlled to be enabled for a predetermined second period of time after the first predetermined period of time.

According to one preferred mode of the present invention, the semiconductor device comprises:

a precharge line (VBLP) that supplies a first potential (VSS) to the bit line; and a precharge element (Q1) that electrically connects the bit line and the precharge line (VBLP);

the test circuit setting the precharge line (VBLP) to the first potential (VSS), in place of the first predetermined potential (½ VDD), and setting the bit line (DL, /DL) to the first potential (VSS) by activation of the precharge element (Q1) by a precharge control signal (BLPR_B).

According to one preferred mode of the present invention, the semiconductor device comprises:

a first sense amplifier (SA) that is connected to the bit line and senses information stored in a memory cell (MC) which is connected to the bit line and stores information therein;

the first predetermined potential (½ VDD) being a potential set as an initial potential for the sensing before the information stored in the memory cell is transmitted to the bit line. The semiconductor device may be configured to comprise a reference potential generation circuit that generates the first predetermined potential and supplies the first predetermined potential to the precharge line (VBLP).

According to one preferred mode of the present invention, the semiconductor device may be configured to comprise:

a first signal line (VSS line) having the first potential; and a switching element (SW2) that electrically connects the first signal line and the precharge line (VBLP);

the first control circuit (CTL1) setting the precharge line (VBLP) to the first potential (VSS) by activation of the switching element (SW2) and setting the bit line to the first potential (VSS) through the precharge element (Q1) that is made conductive by the precharge control signal (BLPR_B).

According to one of preferred modes of the present invention, the test circuit may be configured to perform control so that the bit line maintains the first potential (VSS) during a test period. That is, during the test period, the precharge control signal (BLPR_B) is held to the value that renders the precharge element (Q1) conductive.

According to one of preferred modes of the present invention, the semiconductor device may be configured to comprise a first transistor (Q2) that sets the data bus line (LIOT/LION) to the second potential (VDD1). The test circuit performs control so that the first transistor (Q2) is activated (conductive) during an initial period of the test period, and the first transistor (Q2) is deactivated (non-conductive) during a late period of the test period after the initial period, using the first test control signal (FB).

According to one of preferred modes of the present invention, the semiconductor device may comprise:

a second sense amplifier (MainAmp: Read AMP) that is connected to the data bus line (LIOT/LION) and senses information stored in the memory cell through the bit line and the selection transistor; and a second transistor (transistors Q4-1 to Q4-3 in FIG. 7) that supplies a second predetermined potential (VDD2) to the data bus line. The second predetermined potential (VDD2) is a potential set as an initial potential for the sensing of the second sense amplifier (MainAmp: Read AMP) before the information stored in the memory cell is transmitted to the data bus line (LIOT/LION). The second predetermined potential (VDD2) may be set to be the same as the second potential (VDD1). The second potential (VDD1) may be a power supply potential (VDD).

According to one of preferred modes of the present invention, the test circuit may control the write amplifier (17) to be deactivated during the test period.

According to one of preferred modes of the present invention, the semiconductor device may be configured to include:

a plurality of the bit lines;

a plurality of the data bus lines corresponding to the bit lines; and a plurality of the selection transistors (Q3) that electrically connect the plurality of the bit lines and the plurality of the data buses, respectively.

The plurality of the selection transistors are connected in common to a first selection signal line (YS). The test circuit (20) detects that the potentials of the plurality of the data bus lines changes from the second potential to the first potential.

According to one of preferred modes of the present invention, the semiconductor device may be configured to comprise:

a memory cell that is connected to the bit line and stores information therein; and a sense amplifier (SA) that senses the information stored in the memory cell.

A first one (DL) of the bit lines included in the plurality of the bit lines is connected to a first node of the first sense amplifier. A second one (/DL) of the bit lines included in the plurality of the bit lines is connected to a second node of the sense amplifier. The sense amplifier senses information stored in the memory cell related to one of the first and second bit lines. The plurality of the selection transistors (Q3) respectively correspond to the first and second bit lines being connected in common to the first selection signal line (YS). The detection circuit (20) commonly sets the first and second bit lines to the first potential (VSS) and detects that the potentials of the plurality of the data bus lines respectively corresponding to the first and second bit lines (DL, /DL) changes from the second potential to the first potential.

According to one of preferred modes of the present invention, the semiconductor device may be configured to include:

a plurality of the bit lines;

a plurality of the data bus lines corresponding to the plurality of the bit lines; and a plurality of the selection transistors (Q3) that electrically connect the plurality of the bit lines and the plurality of the data bus lines, respectively. The plurality of the selection transistors (3) are respectively connected to first and second selection signal lines (YS0, YS1 or YSN). The detection circuit (20) detects that the potential of the plurality of the data bus lines change from the second potential to the first potential.

According to one of preferred modes of the present invention, the semiconductor device further comprises:

a plurality of memory cells connected to the plurality of the bit lines, each of the memory cells storing information therein; and first and second sense amplifiers each of which senses the information in a corresponding one of the plurality of memory cells. A first one of the bit lines included in the plurality of the bit lines is connected to a first node of the first sense amplifier. A second one of the bit lines included in the plurality of the bit lines is connected to a second node of the first sense amplifier. A third one of the bit lines included in the plurality of the bit lines is connected to a first node of the second sense amplifier. A fourth one of the bit lines included in the plurality of the bit lines being connected to a second node of the second sense amplifier. The first sense amplifier senses information stored in the memory cell related to one of the first and second bit lines. The second sense amplifier senses information stored in the memory cell related to one of the third and fourth bit lines. The plurality of the selection transistors (Q3) respectively corresponding to the first and second bit lines are connected in common to the first selection signal line (such as YS0). The plurality of the selection transistors (Q3) respectively corresponding to the third and fourth bit lines are connected in common to the second selection signal line (such as YS1, . . . or YSN). The test circuit commonly sets the first to fourth bit lines to the first potential (VSS) to detect that the potential of the plurality of the data bus lines respectively corresponding to the first to fourth bit lines change from the second potential (VDD) to the first potential (VSS).

Further, according to one of preferred modes of the present invention, the semiconductor device includes:

first and second groups each including a plurality of the bit lines;

a plurality of the data bus lines corresponding in common to the first and second groups; and third and fourth groups each including a plurality of the selection transistors electrically connecting the plurality of the bit lines included in a corresponding one of the first and second groups and the plurality of the data bus lines corresponding to the plurality of the bit lines. The plurality of the selection transistors of third and fourth groups are respectively connected to the first and second selection signal lines (YS0 and YS1, . . . or YSN) corresponding thereto. The test circuit detects that potentials of the plurality of the data bus lines changes from the second potential to the first potential.

According to one of preferred modes of the present invention, the semiconductor device further includes:

fifth and sixth groups each including a plurality of the bit lines;

a plurality of the data bus lines corresponding in common to the fifth and sixth groups; and seventh and eighth groups each including a plurality of the selection transistors electrically connecting the plurality of the bit lines included in a corresponding one of the fifth and sixth groups and the plurality of the data bus lines corresponding to the plurality of the bit lines.
The plurality of the selection transistors of the seventh and eighth groups are respectively connected to the first and second selection signal lines (YS0 and YS1, . . . or YSN) corresponding thereto. The test circuit detects that the data bus lines corresponding in common to the first and fifth groups and each of the data lines corresponding in common to the second and sixth groups change from the second potential to the first potential.

According to one of preferred modes of the present invention, the semiconductor device further comprises:

a plurality of memory cells which are connected to the pluralities of the bit lines and each of which stores information therein; and a plurality of sense amplifiers each of which senses the information in a corresponding one of the pluralities of memory cells.
The plurality of sense amplifiers including:

a plurality of first sense amplifiers common to the first and fifth groups; and a plurality of second sense amplifiers common to the second and sixth groups.
The plurality of the bit lines included in the first group are connected to first nodes of the plurality of first sense amplifiers respectively corresponding to the plurality of the bit lines. The plurality of the bit lines included in the fifth group are connected to second nodes of the plurality of first sense amplifiers respectively corresponding to the plurality of the bit lines. The plurality of the bit lines included in the second group are connected to first nodes of the plurality of second sense amplifiers respectively corresponding to the plurality of the bit lines. The plurality of the bit lines included in the sixth group are connected to second nodes of the plurality of second sense amplifiers respectively corresponding to the plurality of the bit lines. Each of the plurality of first sense amplifiers senses information stored in one of the memory cells related to one of the plurality of the bit lines included in the first group and the plurality of the bit lines included in the fifth group. Each of the plurality of second sense amplifiers senses information stored in one of the memory cells related to one of the plurality of the bit lines included in the second group and the plurality of the bit lines included in the sixth group. The plurality of the selection transistors included in the third group and the plurality of the selection transistors included in the seventh group are connected in common to the first selection signal line (YS0). The plurality of the selection transistors included in the fourth group and the plurality of the selection transistors included in the eighth group are connected in common to the second signal line (YS1 or YSN). The test circuit commonly sets the pluralities of the bit lines to the first potential to detect that the potentials of the plurality of the data bus lines corresponding in common to the first and second groups and the plurality of the data bus lines corresponding in common to the fifth and sixth groups change from the second potential to the first potential. The following describes exemplary embodiments with reference to drawings.

First Exemplary Embodiment

Figure 5:
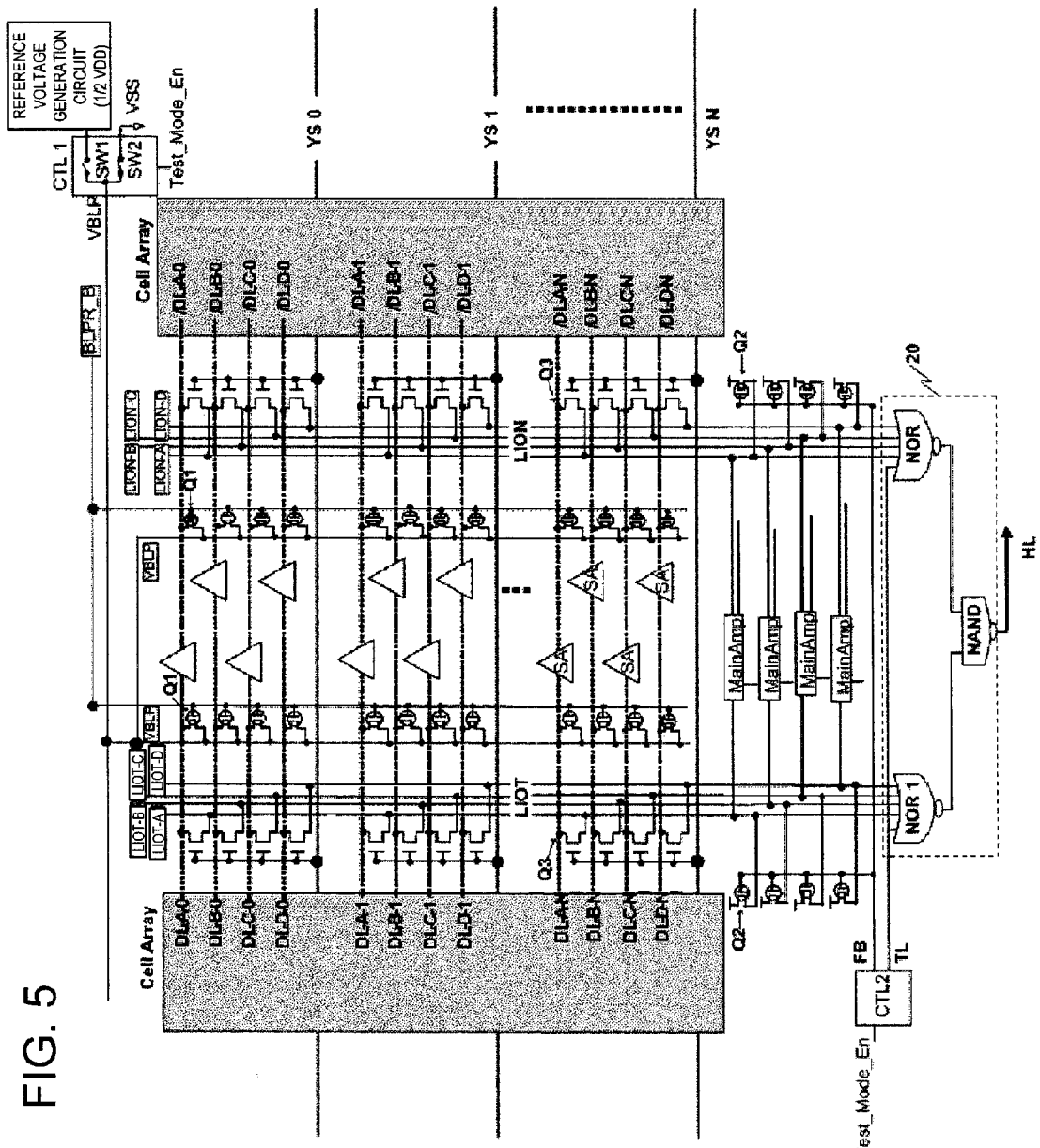
FIG. 5 is a diagram showing a configuration of a first exemplary embodiment of the present invention.

FIG. 5 is a diagram showing a configuration of a first exemplary embodiment of the present invention. Though no particular limitation is imposed, a description will be given in connection with an example in which the present invention is applied to a semiconductor device described with reference to FIGS. 1 to 3. In the present exemplary embodiment, descriptions of components that are the same as those in FIG. 3 will be appropriately omitted so as to avoid repetition. The following description will be mainly directed to a difference between FIG. 5 and FIG. 3. The following description will be given, using an open bit line structure as an example. The present invention is not, however, limited to such a configuration, and can be, as a matter of course, similarly applied to a folded bit line structure or the like.

Figure 3:
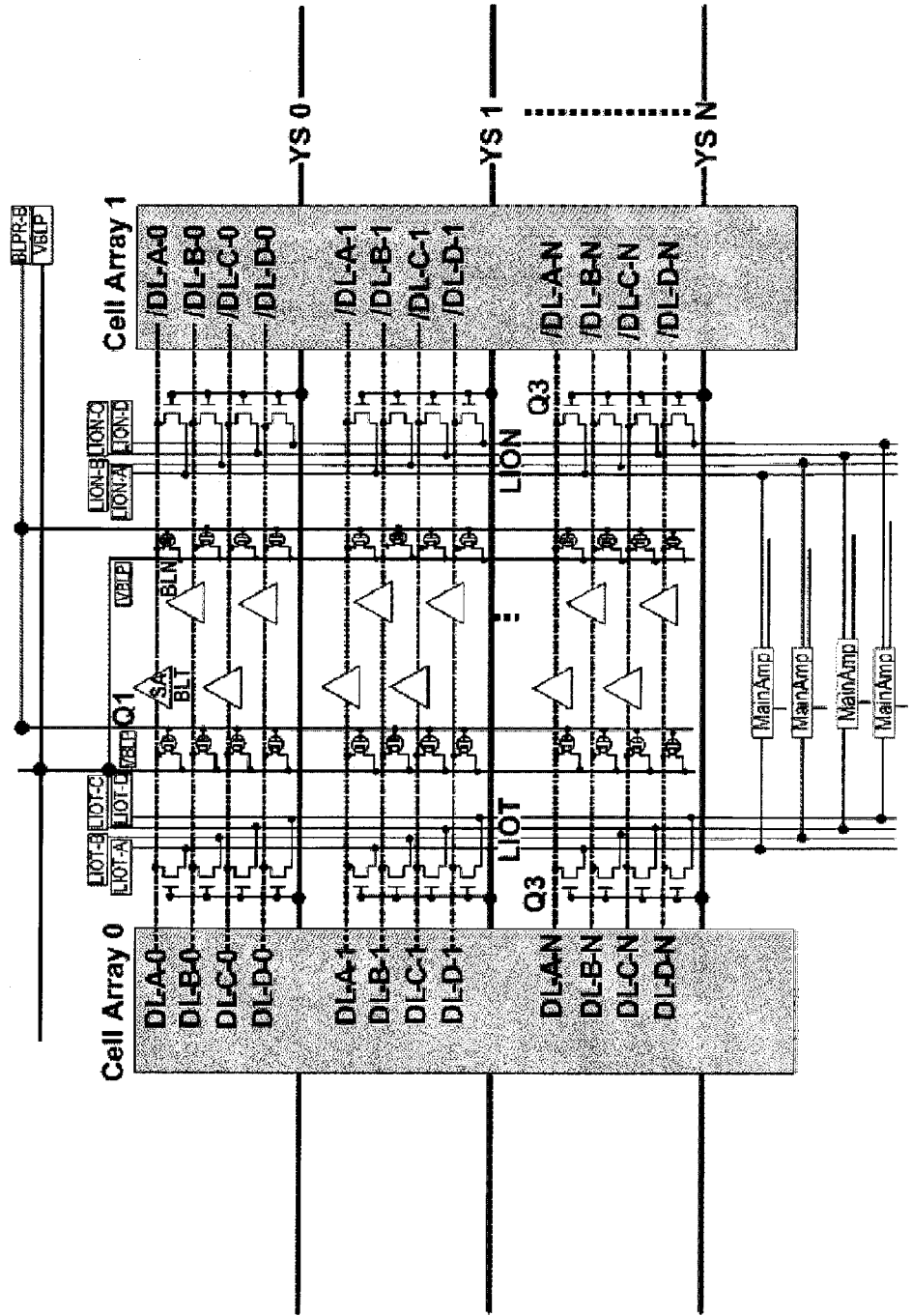
FIG. 3 is a diagram showing a configuration example of the open bit line system.
Figure 4:
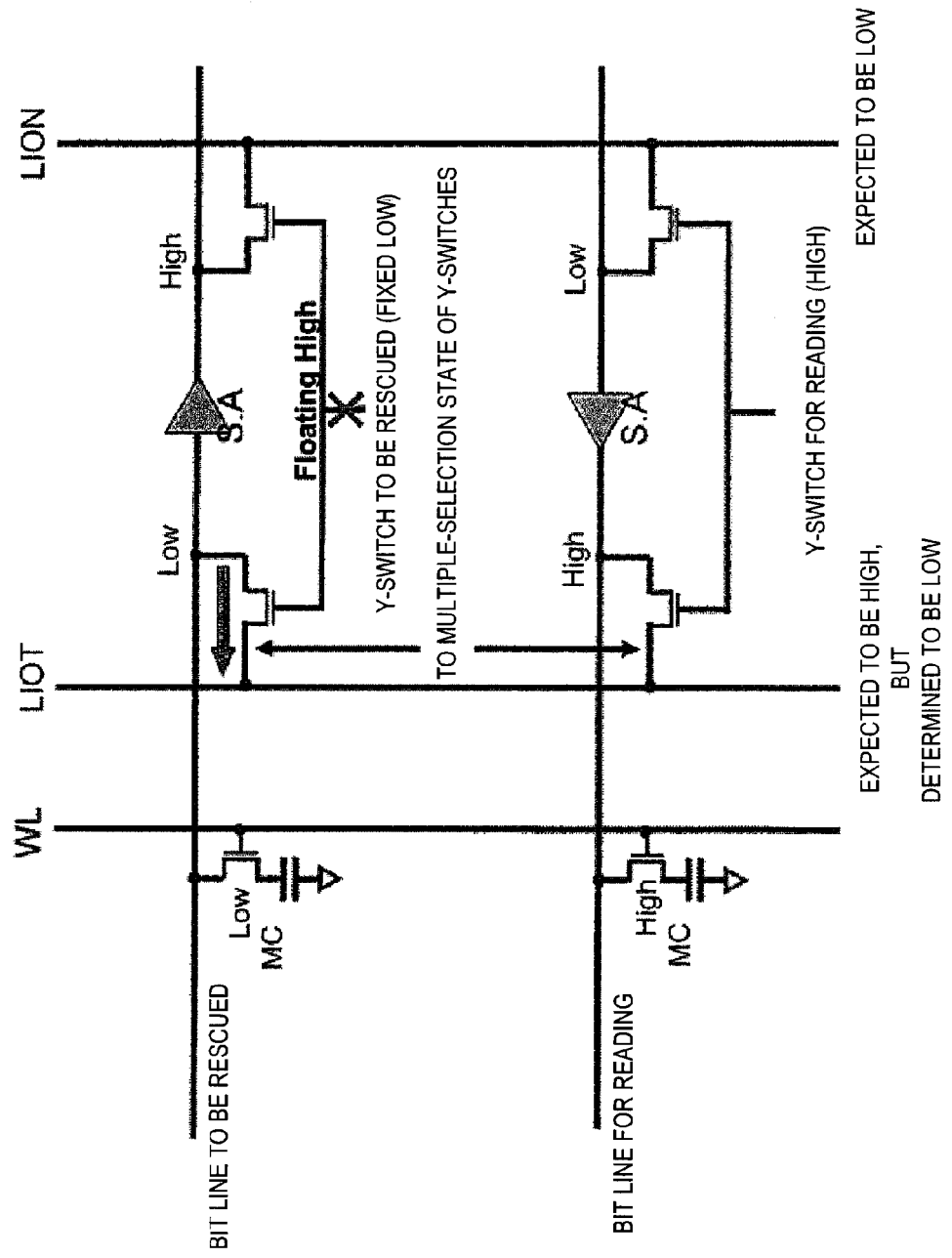
FIG. 4 is a diagram explaining multi-selection when an open failure occurs.

Referring to FIG. 5, in the present exemplary embodiment, the following circuits and transistors are further provided for the configuration shown in FIG. 3:

(a) a first control circuit CTL1 that includes changeover switches (SW1, SW2) for performing switching so that
 a power supply voltage VSS is supplied at a time of a test and a voltage ½ VDD from a reference voltage generation circuit is supplied at a time of a normal operation,
 as a voltage (precharge voltage) for a bit line precharge line VBLP, based on a Test_Mode_Enable signal which is activated in a test mode;

(b) a second control circuit CTL2 that receives the Test_Mode_Enable signal and in the test mode, sets a first test control signal TL to Low and sets a second test control signal FB to Low for a predetermined period (first period of time) and then sets the second test control signal FB to High;

(c) PMOS transistors Q2 which are respectively provided between a predetermined power supply potential (VDD1) and each of LIOT and LION lines of LIOT-A to LIOT-D lines and LION-A to LION-D lines, each of the PMOS transistors Q2 receiving the second test control signal FB at a gate thereof; and (d) a detection circuit 20 that includes:

a five-input NOR circuit NOR1 that receives potentials on the LIOT-A to LIOT-D lines and the first test control signal TL;

a five-input NOR circuit NOR2 that receives potentials on the LION-A to LION-D lines and the first test control signal TL; and a two-input NAND circuit NAND that receives outputs of the NOR circuits NOR1 and NOR2.

When the first test control signal TL is Low in the detection circuit 20, the circuits NOR1 and NOR2 are activated. When LIOT-A to LIOT-D lines and the LION-A to LION-D lines are all Low, each of the circuits NOR1 and NOR2, whose five inputs are all Low, outputs a High level. Then, the circuit NAND, receiving two input of the High level, outputs a Low level. When one of the LIOT-A to LIOT-D lines and the LION-A to LION-D lines is High in the test mode, at least one of the circuits NOR1 and NOR2 outputs a Low level and the circuit NAND outputs a High level, thereby enabling detection of a defect of the column selection transistor. An output signal HL of the circuit NAND in the detection circuit 20 may also be output to a tester from an external terminal of the semiconductor device. Though no particular limitation is imposed, if an open failure of a column selection transistor in the device under test (DUT) is detected, the device under test (DUT) may be discarded as an unrescuable device (noGO (fail device)). Alternatively, in a semiconductor device for which a remedy for recuing a chip is provided for a defect of a column selection transistor, when the output signal HL of the circuit NAND of the detection circuit 20 is High as a result of the test, the remedy may be taken for a column in which the defect has occurred.

The detection circuit 20, the first control circuit CTL1, the second control circuit CTL2, and the transistors Q2 in FIG. 5 added to the configuration shown in FIG. 3 constitute a test circuit introduced according to the present invention.

<Normal Mode>

At a time of a normal operation in the present exemplary embodiment, the second control circuit CTL2 fixes the first test control signal TL at High and fixes the second test control signal FB at High. The transistors Q2 thereby turn off. The first control circuit CTL1 chooses the voltage ½ VDD as a precharge line voltage VBLP. For this reason, the configuration in FIG. 5 performs the normal operation (in which read and write accesses are normally performed), which is the same as that of the configuration in FIG. 3. The first test control signal TL is fixed at High. Thus, outputs of the circuits NOR1 and NOR2 are Low, so that an output of the circuit NAND is High. The value of the output signal HL of the detection circuit 20 is ignored in the normal operation.

<Test Mode>

Figure 2:
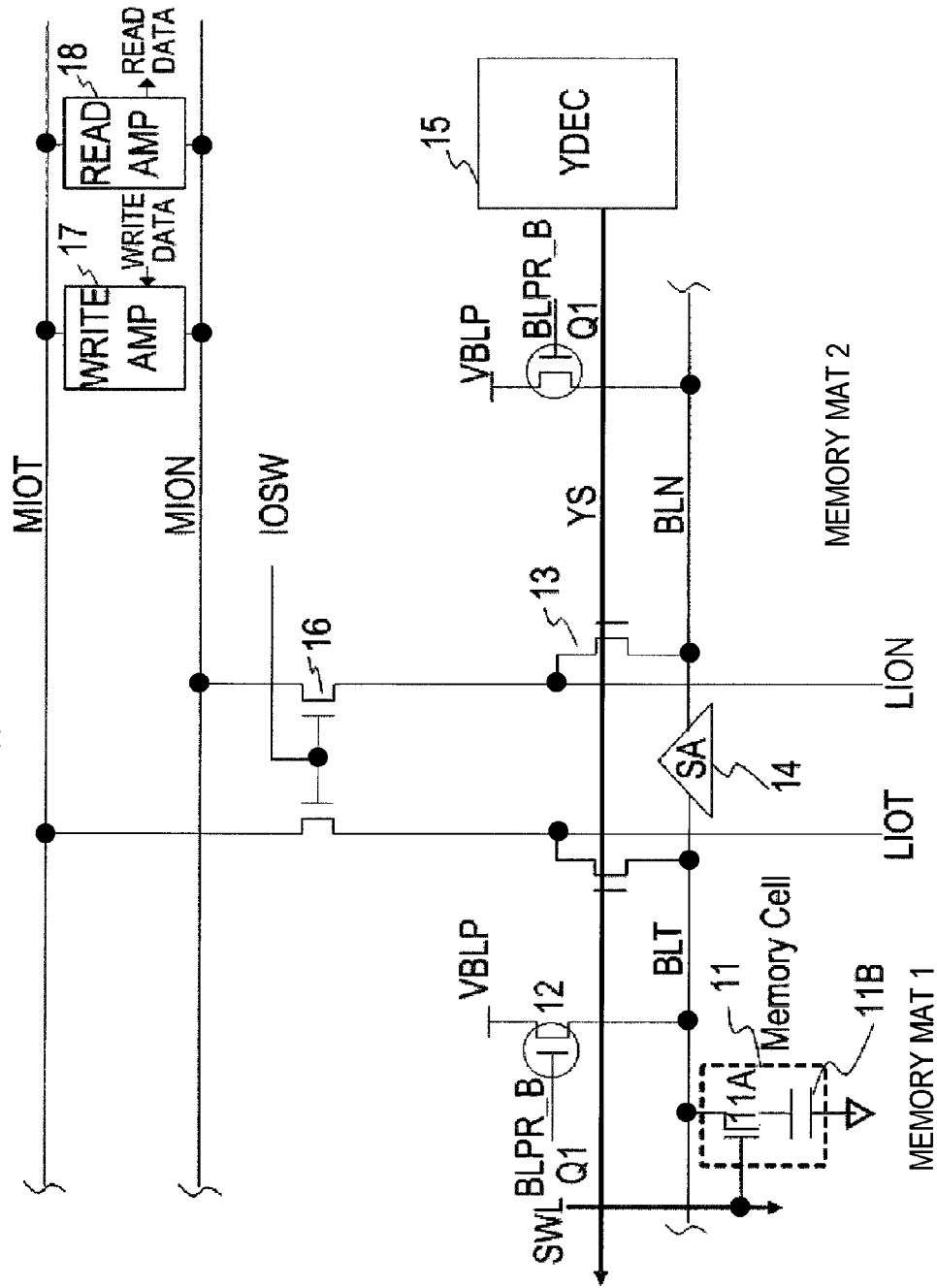
FIG. 2 is a diagram showing a hierarchical data line structure in an open bit line system.

When entry of the test mode is decoded as a result of decoding a command by a control signal generation circuit 8 in FIG. 1, the Test_Mode_En signal is activated. Upon receipt of this Test_Mode_En signal, the first control circuit CTL1 switches the bit line precharge line voltage VBLP from the voltage ½ VDD to the power supply voltage VSS. This switching is performed by two switch elements (SW1 and SW2) shown in FIG. 5. The switch elements SW1 and SW2 can be replaced by one change over switch element. A precharge control signal BLPR_B (generated by the control signal generation circuit 8 in FIG. 1) is set Low, the PMOS transistors Q1 are turned on (made conductive), and bit line pairs DL-A-0 and /DL-A-0 to DL-D-0 and /DL-D-0, and DL-A-N and /DL-A-N to DL-D-N and /DL-D-N are commonly set to the power supply voltage VSS. During a test period, the precharge control signal BLPR_B may be fixed at Low, and the bit line pairs may be constantly connected to a power supply VSS.

When the Test_Mode_En signal is activated, the second control circuit CTL2 sets the first test control signal TL to Low. When the Test_Mode_En signal is activated, the second control circuit CTL2 temporarily sets the second test control signal FB to Low, thereby turning on the PMOS transistors Q2 (making the PMOS transistors conductive) to precharge the LIO lines LIOT and LION to a High level. Then, before a column selection signal is activated, the second control circuit CTL2 sets the second test control signal FB to High from Low, thereby turning off the PMOS transistors Q2 (making the PMOS transistors Q2 non-conductive). The LIO lines LIOT and LION are thereby in a High floating state. When a column selection signal (YS0) selected by a column decoder goes High in this state, column selection transistors Q3 with gates thereof connected to the column selection signal (YS0) turn on (become conductive). The LIO line LIOT-A and the bit line DL-A-0 of the bit line pair DL-A-0 and /DL-A-0 become electrically connected. The LIO line LION-A and the bit line /DL-A-0 of the bit line pair DL-A-0 and /DL-A-0 become electrically connected. The LIO line LIOT-B and the bit line DL-B-0 of the bit line pair DL-B-0 and /DL-B-0 become electrically connected. The LIO line LION-B and the bit line /DL-B-0 of the bit line pair DL-B-0 and /DL-B-0 become electrically connected. The LIO line LIOT-C and the bit line DL-C-0 of the bit line pair DL-C-0 and /DL-C-0 become electrically connected. The LIO line LION-C and the bit line /DL-C-0 of the bit line pair DL-C-0 and /DL-C-0 become electrically connected. The LIO line LIOT-D and the bit line DL-D-0 of the bit line pair DL-D-0 and /DL-D-0 become electrically connected. The LIO line LION-D and the bit line /DL-D-0 of the bit line pair DL-D-0 and /DL-D-0 become electrically connected. Electric charges on the LIO lines LIOT-A and LION-A to LIOT-D and LION-D are then discharged to the power supply VSS, and potentials on the LIO lines LIOT-A and LION-A to LIOT-D and LION-D gradually become Low (a gradient to a LOW level of the voltage of each LIO line being defined by the capacitance of the LIO line and drain current (discharge current) that flows through the column selection transistor). As a result, the LOW potentials are all supplied to the circuits NOR1 and NOR2. A High level is thereby output from each of the circuits NOR1 and NOR2. The two-input NAND circuit NAND outputs a Low level as the output signal HL (in this case, the column selection transistors Q3 are normal).

Then, the test is carried out with respect to each of column selection signals YS1 to YSN as well, as in the case of the column selection signal YS0. The column selection signal YS1, which is adjacent to the column selection signal YS0, will be described as an example. The second test control signal FB is set from High to Low to precharge LIO lines LIOT and LION to the power supply voltage VDD. Then, the second test control signal FB is set from Low to High. The LIO lines LIOT and LION are thereby in a High floating state. The column selection signal (YS1) is set to High in this state. The LIO line LIOT-A and the bit line DL-A-1 become electrically connected and the LIO line LION-A and the bit line /DL-A-1 become electrically connected. The LIO line LIOT-B and the bit line DL-B-1 become electrically connected and the LIO line LION-B and the bit line /DL-B-1 become electrically connected. The LIO line LIOT-C and the bit line DL-C-1 become electrically connected and the LIO line LION-C and the bit line /DL-C-1 become electrically connected. The LIO line LIOT-D and the bit line DL-D-1 become electrically connected. and the LIO line LION-D and the bit line /DL-D-1 become electrically connected. Electric charges on the LIO lines LIOT-A and LION-A to LIOT-D and LION-D are gradually discharged to the power supply VSS, and potentials on the LIO lines LIOT-A and LION-A to LIOT-D and LION-D are gradually set to a Low level. As a result, the Low levels are all supplied to the circuits NOR1 and NOR2. The circuits NOR1 and NOR2 each output a High level. The two-input NAND circuit NAND outputs a Low level as the output signal HL. The column decoder generates the column selection signals (YS0 to YSi), in response to addresses supplied from an outside. Alternatively, the TEST_MODE_En signal may be supplied to the column decoder, and the column selection signals (YS0 to YSi) may be arbitrarily generated according to the TEST_Mode_En signal. Further, an internal address which a BIST (Built-In Self Test) circuit not shown generates according to the TEST_Mode_En signal may be used. The BIST circuit is included in the semiconductor device.

<In the Case of Defect of Column Selection Transistor>

When a contact failure or the like is present in a gate of a specific column selection transistor Q3, the column selection transistor Q3 does not turn on (become conductive), even if the column selection signal is set to a High level. Out of the LIO line pairs of the LIOT and LION lines connected to the bit line pairs through the column selection transistors Q3, one LIO line of the LIO line pair connected to the defective column selection transistor is not electrically connected to the bit line that has been precharged to a VSS level. For this reason, the one LIO line of the LIO line pair is at a High level in a floating state. One of four inputs (LIOT-A to LIOT-D or LION-A to LION-D) except the first test control signal TL is set to a High level at the circuit NOR1 or NOR2. An output of the circuit NOR1 or NOR2 is therefore Low, and the circuit NAND outputs a High level. The High level of the output signal HL of the circuit NAND indicates the defect of the column selection transistor for the selected column.

<Example of Timing Operations>

Figure 6:
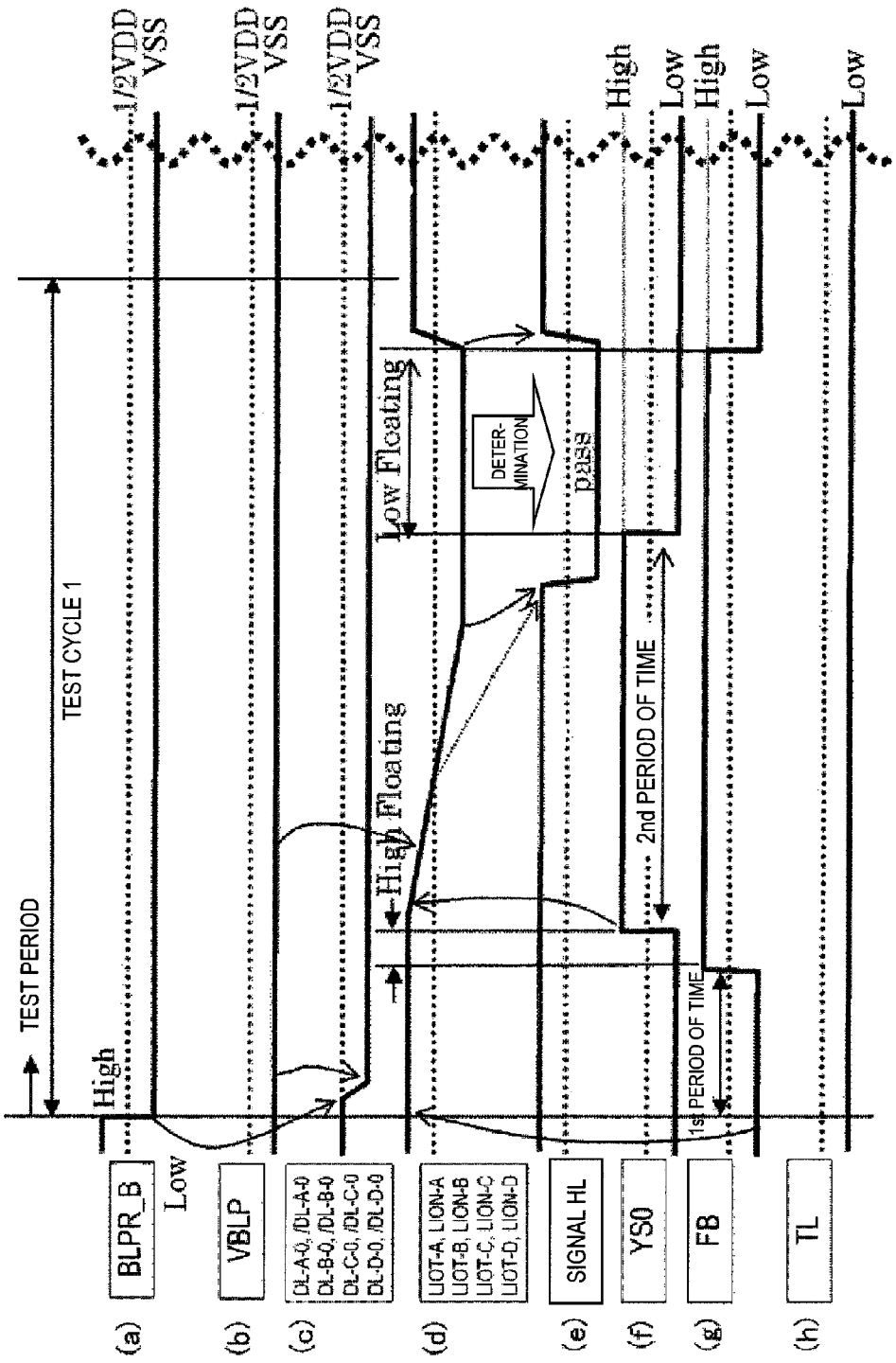
FIG. 6 is a diagram showing operations in the first exemplary embodiment of the present invention.

FIG. 6 is a timing diagram for explaining an operation example in the present exemplary embodiment shown in FIG. 5. FIG. 6 shows a part of operations (operations when the column selection signal YS0 is selected) when the TEST_Mode_En signal indicates a test mode. In FIG. 6, (a) shows a timing waveform of the bit line precharge control signal BLPR_B;
(b) shows a timing waveform of the precharge potential VBLP:
(c) shows a timing waveform of each bit line pair (DL-A-0 and /DL-A-0, DL-B-0 and /DL-B-0, DL-C-0 and /DL-C-0, and DL-D-0 and /DL-D-0);
(d) shows a timing waveform of each LIO line pair (LIOT-A and LION-A, LIOT-B and LION-B, LIOT-C and LION-C, and LIOT-D and LION-D);
(e) shows a timing waveform of the signal HL;
(f) shows a timing waveform of the column selection signal YS0;
(g) shows a timing waveform of the second test control signal FB; and
(h) shows a timing waveform of the first test control signal TL.

When the test mode is entered, the precharge control signal BLPR_B is set to a Low level, and the bit line precharge line VBLP is set to the output voltage VSS from the first control circuit CTL1. That is, the transistors Q1 turn on, and the bit line pairs DL-A-0 and /DL-A-0 to DL-D-0 and /DL-D-0 are all set to the voltage VSS.

The second test control signal FB is set to a Low level temporarily (for a first period of time) by the second control circuit CTL2, thereby turning on the transistors Q2 to precharge the LIO line pairs LIOT-A/LION-A to LIOT-D/LION-D to the power supply potential VDD1. Then, the second test control signal FB is set to High, and all of the LIO line pairs LIOT-A/LION-A to LIOT-D/LION-D are set in a floating state.

The second test control signal FB may be set from Low to High, being delayed by a predetermined delay period of time from when a READ access decoded and output by the control signal generation circuit 8 in FIG. 1 transitions to an activated state, for example. In this case, a test to check whether or not the gates of the column selection transistors are in a floating state is carried out according to the READ access. Since an output of a write amplifier 17 is set to a high-impedance state at a time of a READ operation, the need for control for deactivation of the write amplifier 17 by the first test control signal TL is eliminated. Alternatively, timing control may be of course performed so that the second test control signal FB is set to be Low for the predetermined period of time (first period of time) from a timing of transition of the precharge control signal BLPR_B from High to Low and then the second test control signal FB is set to High.

After the second test control signal FB has transitioned to High, the column selection signal YS0 for the selected column is set to High, thereby turning on the selected column selection transistors (Q3) (making the selected column selection transistors (Q3) conductive). The bit line pairs and the LIO line pairs connected to the selected column selection transistors are thereby electrically connected. As a result, the LIO line pairs that are set in a floating state at a High level are electrically connected to the bit line pairs at a power supply potential VSS. Accordingly, electric charges of the LIO line pairs are gradually discharged to a Low level.

The second test control signal FB is set to be High for a predetermined period of time. The column selection signal YS0 transitions from High to Low with the second test control signal FB being High. When the column selection signal YS0 goes Low, the column selection transistors (Q3) with the gates thereof connected to the column selection signal YS0 turn from on (conductive) to off (non-conductive). The LIO line pairs are electrically disconnected from the bit line pairs at the power supply potential VSS, and the LIO line pairs are set to a Low level in a floating state (are brought into a Low floating state). The Low level of the LIO line pair is detected by the circuits NOR1, NOR2, and NAND. When the column selection transistors are normal, the output signal HL of the circuit NAND assumes the Low level.

On the other hand, even if the column selection signal YS0 goes High, at least one LIO line of the LIO line pair is not electrically connected to one bit line of the bit line pair due to a defect of at least one transistor of a column selection transistor pair or the like, electric charge on the at least one LIO line is not discharged to the power supply VSS, and the at least one LIO line remains in a High floating state. During a period in which the column selection signal is High, and after the column selection signal changes from High to Low, the at least one LIO line remains in a High floating state. At least one output of the circuit NOR1 and NOR2 connected to the one LIO line goes Low. The output signal HL of the circuit NAND therefore goes High, thereby notifying detection of the defect of the at least one column selection transistor.

After detection by the detection circuit 20 has been finished, the second test control signal FB is set to Low again for a test for a next column. Though no particular limitation is imposed, a GO/noGO test, for example, may be finished when a defect of one column selection transistor is detected by the detection circuit 20, and the device including the defective column selection transistor may be sorted out as a defective product. On the other hand, when a predetermined remedy is prepared for the defect of the column selection transistor in the semiconductor device, detection of a column selection transistor defect for still another column is performed. In this case, association between the output signal HL of the detection circuit 20 and each of the column selection signals YS0 to YSN may be recorded in a non-volatile memory or the like in the semiconductor device. The remedy for the defect of the column selection transistor is not directly related to the subject of the present invention. Thus, details of the remedy will be omitted.

The PMOS transistors Q2 that set the LIO line pairs LIOT and LION to the power supply potential VDD1 in the test mode in FIG. 5 when the second test control signal FB is Low may be functioned as precharge transistors for the LIO line pairs LIOT and LION in a normal mode (normal operation). In this case, precharge voltages for the LIO line pairs LIOT and LION in the normal mode and the test mode may be set to be the same, and a changeover switch may be provided so that a LIO equalize signal LIO_EQ is supplied in place of the second test control signal FB as the signal to be supplied to the gates of the PMOS transistors Q2 in the normal mode (normal operation). Alternatively, the PMOS transistors Q2 may be of course provided separately from a circuit for precharging the LIO line pairs.

Second Exemplary Embodiment

Figure 7:
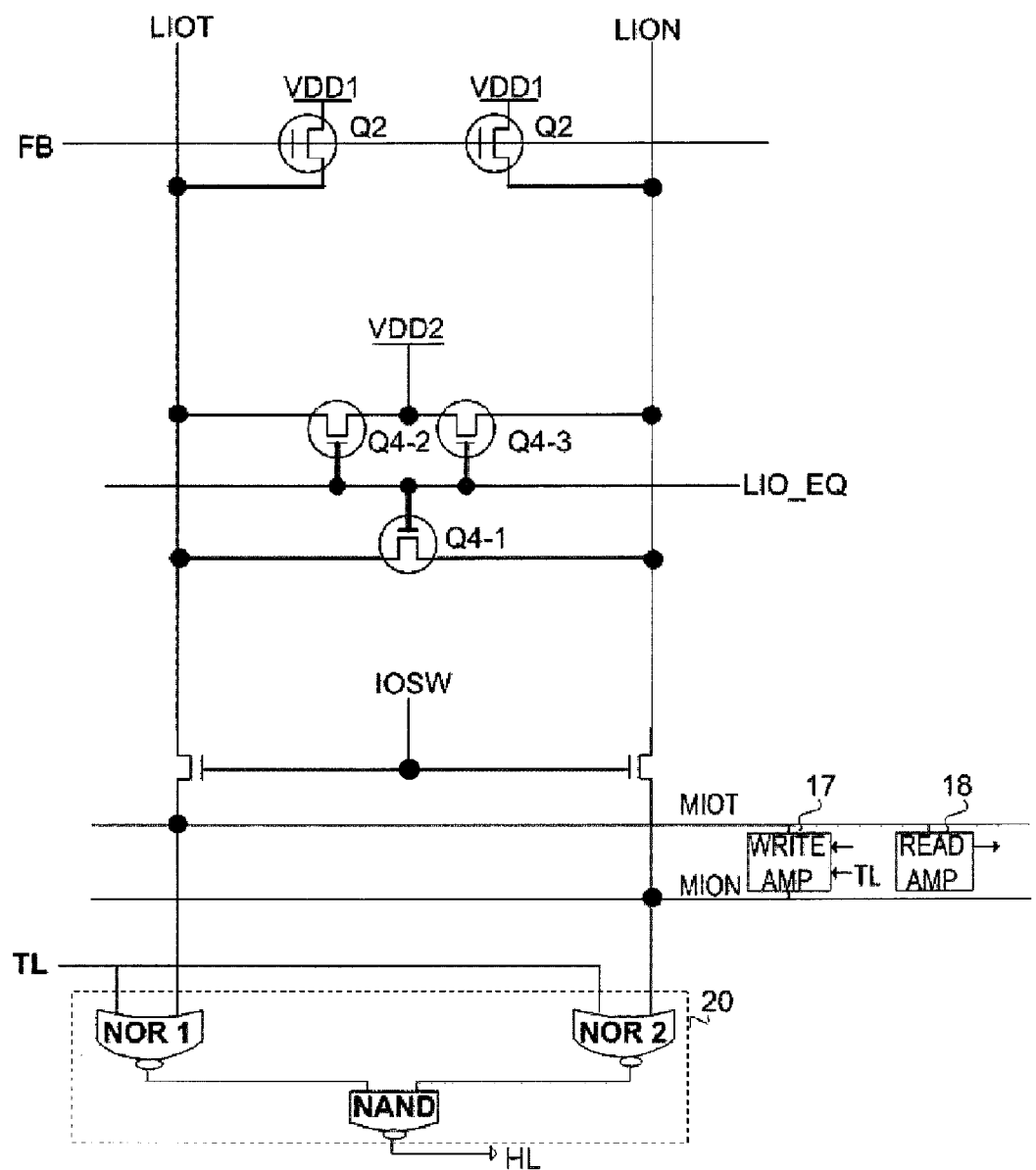
FIG. 7 is a diagram showing a configuration of a second exemplary embodiment of the present invention.

FIG. 7 is a diagram showing a configuration of a second exemplary embodiment of the present invention. In addition to PMOS transistors Q2 (corresponding to the PMOS transistors Q2 in FIG. 5) that set LIO line pairs LIOT/LION to a power supply potential VDD1 when a second test control signal FB is Low in a test mode, PMOS transistors Q4-1, Q4-2, and Q4-3 for precharging and equalizing the LIO line pairs LIOT/LION to a power supply potential VDD2 in a normal mode (normal operation) operation are provided. During a (normal) operation in the normal mode, the second test control signal FB is fixed at High, so that the transistors Q2 are constantly turned off (non-conductive). When a LIO equalize signal LIO_EQ is Low, the LIO line pairs LIOT/ LION are precharged and equalized to the power supply potential VDD2.

Third Exemplary Embodiment

FIGS. 8A to 8C is a diagram showing a configuration of a third exemplary embodiment of the present invention. In the exemplary embodiments described before, the detection circuit 20 is connected to the local input/output lines, thereby detecting a defect of at least one of the column selection transistors. In the present exemplary embodiment, as shown in FIG. 8A, a detection circuit 20 is connected to main input/ output lines MIOT and MION. A logic configuration of the detection circuit 20 is configured to be the same as that of the detection circuit 20 in the first exemplary embodiment shown in FIG. 5. A first control circuit CTL1 shown in FIG. 8B outputs a voltage to the bit line precharge line VBLP for precharging bit line pairs (VLBP is connected to sources of PMOS transistors Q1 with drains connected to the bit line pair BLT and BLN, respectively). The first control circuit CTL1 outputs a voltage output from a reference voltage generation circuit to the VBLP, when the Test_Mode_En signal is inactive (in a normal mode), and outputs a VSS voltage to the VBLP, when the Test_Mode_En signal is active (in a Test mode). A second control circuit CTL2 shown in FIG. 8C generates first and second test control signals TL and FB based on the Test_Mode_En signal. The second test control signal FB is supplied to gates of PMOS transistors Q2 with sources connected in common to VDD1 and drains connected to LIOT and LION, respectively. The first test control signal TL is supplied to the detection circuit 20 and the write amplifier 17.

Control sequence of precharging of bit line pairs BLT and BLN to a power supply voltage VSS;

setting of the first test control signal TL to Low by the second control circuit CTL2;

setting of a second test control signal FB by the second control circuit CTL2 to High (turning on Q2 to precharge LIOT and LION to VDD1) after setting of the second test control signal FB to Low for a predetermined period of time;

turning on of a column selection transistor (Q3) due to setting of a column selection signal for a selected column to High; and subsequent turning off of the column selection transistor; is the same as that in the first exemplary embodiment described with reference to FIGS. 5 and 6. A test mode enable signal Test_Mode_En is supplied to a column decoder (YDEC) 15, and a column selection signal YS is output at a timing as shown in FIG. 6, for example.

A selected LIO line pair LIOT/LION is connected to a kth MIO line pair MIOT <k>/MION <k> (k being one or a predetermined positive integer) through switches (SWCs) 16 set to be on, so that levels of the LIO line pair LIOT/LION are transmitted to the kth MIO line pair MIOT <k>/MION <k>.

The configuration in the third exemplary embodiment includes a circuit NOR1 that receives a plurality of MIOT <k> lines and the first test control signal TL, a circuit NOR2 that receives a plurality of MION <k> lines and the first test control signal TL, and a circuit NAND that receives outputs of the circuits NOR1 and NOR2.

In the test mode, the column selection signal is set to High with LIO line pair LIOT/LION being in a High floated state, and the LIO line pair LIOT/LION is connected to the bit lines BLT and BLN at the power supply voltage VSS. Then, the LIO line pair LIOT/LION is discharged to a Low level. Then, the column selection signal is set to Low, and both of Low levels (Low floating) of the LIO line pair LIOT/LION are detected by the levels transmitted to the MIO line pair MIOT <k>/MION <k> connected to the LIO line pair LIOT/LION through the switches 16. This test is carried out in a READ mode. An output of a write amplifier is thereby set to a High-impedance state. Alternatively, a write amplifier 17 may be so configured that when a control signal TL is Low, the output of the write amplifier 17 is set to the High-impedance state, in the test mode.

According to this exemplary embodiment, one detection circuit 20 is provided in common to a plurality of MIO line pairs. Thus, this exemplary embodiment is effective in terms of reduction of an increase in the circuit size of the test circuit. That is, when a defect is present in one of column selection transistors corresponding to one bit line of (M) bit line pairs connected to (L) LIO line pairs connected to (K) MIO line pairs, or the one of the column selection transistors corresponding to K×L×M bit line pairs, this column selection transistor is decided to be defective. The configuration in the present exemplary embodiment is effective when applied to a case where when even one of defects (such as an open failure of the gate of) of a column selection transistor is detected in a device test, a process of identifying a defective location of the column selection transistor, for remedy, is not performed, and the device with the detective column selection transistor is sorted out as not capable of being rescued (noGO).

In each of the exemplary embodiments described above, the description was given, using the open bit line structure as an example. The present invention can be of course applied to a memory of a hierarchical I/O structure in a folded bit line system as well.

The technical concepts of the present application can be applied to a transfer route for a data signal of a memory or a data processor, or the like, for example. The configuration of the control circuit for generating a control signal is not limited to a circuit type disclosed in an example. Referring to FIGS. 2, 3, 5, and 8, the description was given to the example where the column selection transistors Q3 are the NMOS transistors and each of the precharge elements Q1 and Q2 is formed of the PMOS transistor. Polarities of various transistors in the present invention are not of course limited to the configurations that have been illustrated.

The technical concepts of the present invention can be applied to various semiconductor devices. To take an example, the present invention can be applied to semiconductor devices in general such as CPU (Central Processing Unit), MCU (Micro Control Unit), a DSP (Digital Signal Processor), ASIC (Application Specific Integrated Circuit), ASSP (Application Specific Standard Product), and memory (Memory). As types of products of semiconductor devices to which the present invention is applied, SOC (system on chip), MCP (multi-chip package), POP (package on package), and the like can be pointed out. The present invention can be applied to these semiconductor devices having arbitrary types of products or arbitrary package types. The transistors should be just field effect transistors (Field Effect Transistors; FETs). The present invention can be applied to various FETs such as MIS (Metal-Insulator Semiconductor) and TFT (Thin Film Transistor) other than MOS (Metal Oxide Semiconductor). The present invention can be applied to various FETs such as transistors. Further, some transistors in the device may be replaced by bipolar type transistors. Further, the PMOS transistor (P channel MOS transistor) is a typical example of the transistor of a second conductivity type, while the NMOS transistor (N channel MOS transistor) is a typical example of the transistor of a first conductivity type.

Modifications and adjustments of the exemplary embodiments and an example of the present invention are possible within the scope of the overall disclosure (including claims) of the present invention, and based on the basic technical concept of the invention. Various combinations and selections of various disclosed elements are possible within the scope of the claims of the present invention. That is, the present invention of course includes various variations and modifications that could be made by those skilled in the art according to the overall disclosure including the claims and the technical concept.

What is claimed is:

1. A semiconductor device comprising:
   a bit line;
   a data bus line provided corresponding to said bit line;
   a selection transistor that controls electrical connection between said bit line and said data bus line;
   a write amplifier that writes data to said bit line through said data bus; and
   a test circuit, wherein
   during a test period,
   said test circuit sets said bit line to a first potential, regardless of an operation of said write amplifier, sets said data bus line to a second potential and then sets said data bus line in a floating state,
   said selection transistor being activated to electrically connect said bit line and said data bus line,
   said test circuit detecting transition of said data bus line from said second potential to said first potential.

2. The semiconductor device according to claim 1, further comprising:
   a precharge line that supplies a first predetermined potential to said bit line; and
   a precharge element that when activated, electrically connects said bit line and said precharge line, wherein
   said test circuit sets said precharge line to said first potential, in place of said first predetermined potential, and activates said precharge element to set said bit line to said first potential.

3. The semiconductor device according to claim 2, further comprising:
   a memory cell that is connected to said bit line and stores information therein; and
   a first sense amplifier that is connected to said bit line and senses information stored in said memory cell,
   said first predetermined potential assuming a potential that is set as an initial potential for sensing by said first sense amplifier, before information stored in said memory cell is transmitted to said bit line.

4. The semiconductor device according to claim 3, further comprising
   a reference potential generation circuit that generates said first predetermined potential and supplies said first predetermined potential to said precharge line.

5. The semiconductor device according to claim 2, further comprising:
   a first signal line having said first potential; and
   a switch element that electrically connects said first signal line and said precharge line, wherein
   said test circuit activates said switch element to set said precharge line to said first potential and sets said bit line to said first potential through said precharge element.

6. The semiconductor device according to claim 1, wherein said test circuit performs control so that said bit line maintains said first potential, during said test period.

7. The semiconductor device according to claim 1, further comprising
   a first transistor that sets said data bus line to said second potential, wherein said test circuit performs control so as to activate said first transistor during an initial period of said test period, and to deactivate said first transistor during a late period of said test period which follows said initial period.

8. The semiconductor device according to claim 7, further comprising:
   a memory cell that is connected to said bit line and stores information therein;
   a second sense amplifier that is connected to said data bus line and senses information stored in said memory cell through said bit line and said selection transistor; and
   a second transistor that supplies a second predetermined potential to said data bus line,
   said second predetermined potential assuming a potential that is set as an initial potential for sensing by said second sense amplifier before information stored in said memory cell is transmitted to said data bus line.

9. The semiconductor device according to claim 1, wherein said test circuit controls to deactivate said write amplifier during said test period.

10. The semiconductor device according to claim 1, comprising:
a plurality of said bit lines;
a plurality of said data bus lines corresponding to said bit lines; and
a plurality of said selection transistors that electrically connect said plurality of said bit lines and said plurality of said data buses, respectively, wherein
said plurality of said selection transistors are connected in common to a first selection signal line, and
said test circuit detects that respective potentials of said plurality of said data bus lines change from said second potential to said first potential.

11. The semiconductor device according to claim 10, comprising:
a memory cell that is connected to said bit line and stores information therein; and
a sense amplifier that senses information stored in said memory cell, wherein
a first one of said plurality of said bit lines is connected to a first node of said sense amplifier,
a second one of said plurality of said bit lines is connected to a second node of said sense amplifier,
said sense amplifier senses information stored in said memory cell related to one of said first and second bit lines,
said plurality of said selection transistors respectively corresponding to said first and second bit lines, are connected in common to said first selection signal line, and
said test circuit commonly sets said first and second bit lines to said first potential and detects that respective potentials of said plurality of said data bus lines respectively corresponding to said first and second bit lines change from said second potential to said first potential.

12. The semiconductor device according to claim 1, including:
a plurality of said bit lines;
a plurality of said data bus lines corresponding to said plurality of said bit lines; and
a plurality of said selection transistors that electrically connect said plurality of said bit lines and said plurality of said data bus lines, respectively, each of said plurality of said selection transistors being connected to a corresponding one of first and second selection signal lines, wherein
said test circuit detects that respective potentials of said plurality of said data bus lines change from said second potential to said first potential.

13. The semiconductor device according to claim 12, further comprising:
a plurality of memory cells connected to said plurality of said bit lines, each of said memory cells storing information therein; and
first and second sense amplifiers each of which senses information stored in a corresponding one of said plurality of memory cells, wherein
a first one of said plurality of said bit lines is connected to a first node of said first sense amplifier,
a second one of said plurality of said bit lines is connected to a second node of said first sense amplifier,
a third one of said plurality of said bit lines is connected to a first node of said second sense amplifier,
a fourth one of said plurality of said bit lines is connected to a second node of said second sense amplifier,
said first sense amplifier senses information stored in said memory cell related to one of said first and second bit lines,
said second sense amplifier senses said information in said memory cell related to one of said third and fourth bit lines,
said plurality of said selection transistors respectively corresponding to said first and second bit lines are connected in common to said first selection signal line,
said plurality of said selection transistors respectively corresponding to said third and fourth bit lines are connected in common to said second selection signal line, and
said test circuit commonly sets said first to fourth bit lines to said first potential to detect that respective potentials of said plurality of said data bus lines respectively corresponding to said first to fourth bit lines change from said second potential to said first potential.

14. The semiconductor device according to claim 1, comprising:
first and second groups, each of said first and second groups including a plurality of said bit lines;
a plurality of said data bus lines corresponding in common to said first and second groups; and
third and fourth groups, each of said third and fourth groups including a plurality of said selection transistors electrically connecting said plurality of said bit lines included in said first and second groups respectively, and said plurality of said data bus lines corresponding to said plurality of said bit lines, wherein
said plurality of said selection transistors included said third and fourth groups are respectively connected to said first and second selection signal lines corresponding thereto, and
said test circuit detects that respective potentials of said plurality of said data bus lines change from said second potential to said first potential.

15. The semiconductor device according to claim 14, further comprising:
fifth and sixth groups, each of said fifth and sixth groups including a plurality of said bit lines;
a plurality of said data bus lines corresponding in common to said fifth and sixth groups; and
seventh and eighth groups, each of said seventh and eighth groups including a plurality of said selection transistors electrically connecting said plurality of said bit lines included in said fifth and sixth groups and said plurality of said data bus lines corresponding to said plurality of said bit lines, wherein
said plurality of said selection transistors of said seventh and eighth groups are respectively connected to said first and second selection signal lines corresponding thereto, and
said test circuit detects that respective potentials of said data bus lines corresponding in common to said first and fifth groups and said data lines corresponding in common to said second and sixth groups change from said second potential to said first potential.

16. The semiconductor device according to claim 15, further comprising:
a plurality of memory cells that are connected to said plurality of said bit lines and that store information therein; and
a plurality of sense amplifiers, each of which senses information stored in a corresponding one of said pluralities of memory cells, said plurality of sense amplifiers including:

a plurality of first sense amplifiers common to said first and fifth groups; and a plurality of second sense amplifiers common to said second and sixth groups, wherein said plurality of said bit lines included in said first group are connected to first nodes of said plurality of first sense amplifiers respectively corresponding to said plurality of said bit lines, said plurality of said bit lines included in said fifth group are connected to second nodes of said plurality of first sense amplifiers respectively corresponding to said plurality of said bit lines, said plurality of said bit lines included in said second group are connected to first nodes of said plurality of second sense amplifiers respectively corresponding to said plurality of said bit lines, said plurality of said bit lines included in said sixth group are connected to second nodes of said plurality of second sense amplifiers respectively corresponding to said plurality of said bit lines, each of said plurality of first sense amplifiers senses information stored in one of said memory cells related to one of said plurality of said bit lines included in said first group and said plurality of said bit lines included in said fifth group, each of said plurality of second sense amplifiers senses information stored in one of said memory cells related to one of said plurality of said bit lines included in said second group and said plurality of said bit lines included in said sixth group, said plurality of said selection transistors included in said third group and said plurality of said selection transistors included in said seventh group are connected in common to said first selection signal line, said plurality of said selection transistors included in said fourth group and said plurality of said selection transistors included in said eighth group are connected in common to said second signal line, and said test circuit commonly sets said plurality of said bit lines to said first potential to detect that respective potentials of said plurality of said data bus lines corresponding in common to said first and second groups and said plurality of said data bus lines corresponding in common to said fifth and sixth groups change from said second potential to said first potential.

17. The semiconductor device according to claim 7, wherein said test circuit includes
first and second control circuits; and
a logic circuit, wherein
said first control circuit connects said bit line to a precharge line, at a time of a test, to set a potential of said bit line to said first potential,
said second control circuit generates a first control signal for controlling electrical connection of said first transistor, and makes said first transistor conductive for a predetermined period of time to set said data bus line to said second potential by said first control signal, and then makes said first transistor non-conductive, thereby controlling said data bus line to be brought in a floating state,
said semiconductor device activates a selection signal for controlling said selection transistor to electrically connect said data bus line and said bit line, with said first transistor being made non-conductive, and then deactivates said selection signal to electrically disconnect said data bus line and said bit line,
said second control circuit further generates a second control signal to be supplied to said logic circuit, said second control signal being activated at said time of said test,
said logic circuit outputs a first logic value when said second control signal indicates activation of said logic circuit and when said logic circuit detects that a potential of said data bus line indicates a logic level corresponding to said first potential,
said logic circuit outputs a second logic value when said second control signal indicates activation of said logic circuit and said potential of said data bus line does not indicates said logic level corresponding to said first potential, and
said logic circuit outputs said second logic value when said second control signal indicates deactivation of said logic circuit.

18. The semiconductor device according to claim 17, wherein said logic circuit outputs said first logic value when said second control signal indicates activation of said logic circuit and when said logic circuit detects that each potential of a plurality of said data bus lines indicates said logic level corresponding to said first potential, and
said logic circuit outputs said second logic value when said potential of at least one of said plurality of said data bus lines does not indicate said logic level corresponding to said first potential.

19. The semiconductor device according to claim 17, wherein said data bus line includes:
a local input/output line connected to said bit line through said selection transistor; and
a main input/output line connected to said local input/output line through a switch,
said logic circuit being connected to said local input/output line.

20. The semiconductor device according to claim 19, wherein said main input/output line is connected to said write amplifier that drives said main input/output line based on write data externally supplied and a read amplifier that amplifies data transmitted to said main input/output line from said local input/output line.

* * * * *